(12) United States Patent
Pool

(10) Patent No.: US 12,346,835 B2
(45) Date of Patent: Jul. 1, 2025

(54) DATA INSPECTION FOR COMPRESSION/DECOMPRESSION CONFIGURATION AND DATA TYPE DETERMINATION

(71) Applicant: NVIDIA Corporation, Santa Clara, CA (US)

(72) Inventor: Jeff Pool, Durham, NC (US)

(73) Assignee: NVIDIA CORPORATION, Santa Clara, CA (US)

( * ) Notice: Subject to any disclaimer, the term of this patent is extended or adjusted under 35 U.S.C. 154(b) by 1212 days.

(21) Appl. No.: 15/914,291

(22) Filed: Mar. 7, 2018

(65) Prior Publication Data

US 2019/0081637 A1    Mar. 14, 2019

Related U.S. Application Data

(60) Provisional application No. 62/556,220, filed on Sep. 8, 2017.

(51) Int. Cl.
*H03M 7/00* (2006.01)
*G06F 12/0866* (2016.01)
(Continued)

(52) U.S. Cl.
CPC ......... *G06N 5/046* (2013.01); *G06F 12/0866* (2013.01); *G06N 7/01* (2023.01);
(Continued)

(58) Field of Classification Search
CPC ........ H03M 7/30; H03M 7/40; H03M 7/3066; H03M 7/6005; H03M 7/3059;
(Continued)

(56) References Cited

U.S. PATENT DOCUMENTS 5,600,726 A * 2/1997 Morgan ................. H03M 7/30
713/189
5,870,036 A * 2/1999 Franaszek ............ H04N 19/132
375/E7.157

(Continued)

OTHER PUBLICATIONS

Clark, Michael, "Accelerating GPU computation through mixed-precision methods," Harvard-Smithsonian Center for Astrophysics, Harvard University, 2010, 28 pages.

*Primary Examiner* — Linh V Nguyen
(74) *Attorney, Agent, or Firm* — Davis Wright Tremaine LLP

(57) ABSTRACT

Distribution of data in a neural network data set is used to determine an optimal compressor configuration for compressing the neural network data set and/or the underlying data type of the neural network data set. By using a generalizable optimization of examining the data prior to compressor invocation, the example non-limiting technology herein makes it possible to tune a compressor to better target the incoming data. For sparse data compression, this step may involve examining the distribution of data (e.g., in one example, zeros in the data). For other algorithms, it may involve other types of inspection. This changes the fundamental behavior of the compressor itself. By inspecting the distribution of data (e.g., zeros in the data), it also possible to very accurately predict the data width of the underlying data. This is useful because this data type is not always known a priori, and lossy compression algorithms useful for deep learning depend on knowing the true data type to achieve good compression rates.

35 Claims, 10 Drawing Sheets

(51) Int. Cl.
*G06N 5/046* (2023.01)
*G06N 7/01* (2023.01)
*H03M 7/24* (2006.01)
*H03M 7/30* (2006.01)

(52) U.S. Cl.
CPC ........... *H03M 7/24* (2013.01); *H03M 7/3059* (2013.01); *H03M 7/3079* (2013.01); *H03M 7/6058* (2013.01); *H03M 7/6088* (2013.01); *G06F 2212/401* (2013.01)

(58) Field of Classification Search
CPC ............. H03M 7/3082; H03M 7/3088; H03M 7/4006; H03M 7/6011; H03M 7/00; H03M 7/3084; H03M 7/3086; H03M 7/3091; H03M 7/4012; H03M 7/4031; H03M 7/46; H03M 7/48; H03M 7/6023; H03M 7/6029; H03M 7/6047; H03M 7/6052; H03M 7/607; H03M 7/6076; H03M 7/70; G06F 3/0608; G06F 3/0673; G06F 12/0802; G06F 12/0811; G06F 13/4027; G06F 16/122; G06F 16/1727; G06F 16/24561; G06F 17/11; G06F 17/16; G06F 2212/401; G06F 3/064; G06F 3/0656; G06F 3/0659; G06F 3/0661; G06F 5/01; G06F 7/5443; G06F 9/30018; G06F 9/30036; G06F 9/30145; G06F 9/3818; G06F 9/3851; G06N 20/00; G06N 3/02; G06N 3/0454; G06N 3/08; G06N 5/025; G06N 3/04; G06N 3/063; G06N 5/003; G06N 20/10; G06N 20/20; G06N 3/0427; G06N 3/0445; G06N 3/084; G06N 7/005
USPC .................................................... 341/51, 107
See application file for complete search history.

(56) References Cited

U.S. PATENT DOCUMENTS

| | | | |
|---|---|---|---|
| 7,447,814 B1 * | 11/2008 | Ekman | G06F 12/0897 711/170 |
| 8,427,347 B1 * | 4/2013 | Chai | H03M 7/30 341/59 |
| 10,382,751 B1 * | 8/2019 | Zhao | H04N 19/105 |
| 2003/0030575 A1 * | 2/2003 | Frachtenberg | H03M 7/3088 341/51 |
| 2003/0090397 A1 * | 5/2003 | Rasmussen | H03M 7/3086 341/51 |
| 2013/0033389 A1 * | 2/2013 | Bendel | H03M 7/30 341/50 |
| 2015/0264586 A1 * | 9/2015 | Girardeau | G01R 23/00 370/252 |
| 2015/0333766 A1 * | 11/2015 | Nasser | H03M 7/46 341/59 |
| 2017/0293659 A1 * | 10/2017 | Huang | H03M 7/3066 |
| 2018/0293776 A1 * | 10/2018 | Ray | G09G 5/363 |
| 2019/0034334 A1 * | 1/2019 | Arelakis | H03M 7/40 |
| 2019/0068217 A1 * | 2/2019 | Bannon | H04N 19/436 |
| 2020/0228136 A1 * | 7/2020 | Huang | G06F 13/4027 |

* cited by examiner

Deep Neural Network

DATA INSPECTION FOR COMPRESSION/DECOMPRESSION CONFIGURATION AND DATA TYPE DETERMINATION

CROSS-REFERENCE TO RELATED APPLICATIONS

This application claims benefit of U.S. Provisional Patent Application No. 62/556,220 filed Sep. 8, 2017, incorporated herein by reference.

STATEMENT REGARDING FEDERALLY SPONSORED RESEARCH OR DEVELOPMENT

None.

FIELD

This technology relates to deep learning, machine learning and artificial intelligence, and to sparse data compressors and decompressors in such systems. More particularly, the technology herein relates to graphics processing unit (GPU) memory architectures including hardware-based sparse data compression/decompression (CODEC) capabilities for compressing and decompressing sparse data sets of the type use in/generated by deep neural networks (DNNs). This technology also relates to data inspection for determining data type and/or compression/decompression unit size, and more particularly to inspecting data distribution in neural network data to determine underlying data type and/or granularity (size) of units for compressing and decompressing sparse neural network data.

BACKGROUND

Compression algorithms can perform better with knowledge of the incoming data type. Graphics data compressors are often told what type of data they are receiving, as well as the layout of that data, but generic compressors may not receive information about the incoming data.

Deep learning workloads can consist of very sparse data. Sparse data compressors typically do not have this extra decoration.

Possible solutions to achieving maximum compression for such sparse data include: spending (chip) area on multiple copies of nearly-identical compressors, trying to compress with the same physical compressor multiple times in a row, or performing post-processing to attempt to make up for sub-optimal configuration of the main compression path. However, these approaches cost area, latency, complexity, or some combination of the three.

For example, compressing the same data with different compressors and picking the best compression result wastes large areas of a hardware chip and/or processing cycles and is not always possible. Successively using the same physical compressor (e.g., three times in a row) with a different configuration each time can needlessly complicate pipelining the compression stage, (at least) triples the latency of this operation, and require extra bookkeeping logic. As for post-processing solutions, it is also clear that metadata indicating data type is overhead in sub-optimal configurations. By starting with the assumption that the data is a certain format (e.g., 1B), a tight compaction of e.g., the nonzero data can be achieved, but a non-trivial entropy coding step would be wanted to compress the mask metadata—requiring much more complex hardware and extra latency.

BRIEF DESCRIPTION OF THE DRAWINGS

The following detailed description of example non-limiting illustrative embodiments is to be read in conjunction with the drawings, of which.

DETAILED DESCRIPTION OF EXAMPLE NON-LIMITING IMPLEMENTATIONS

Figure 1:
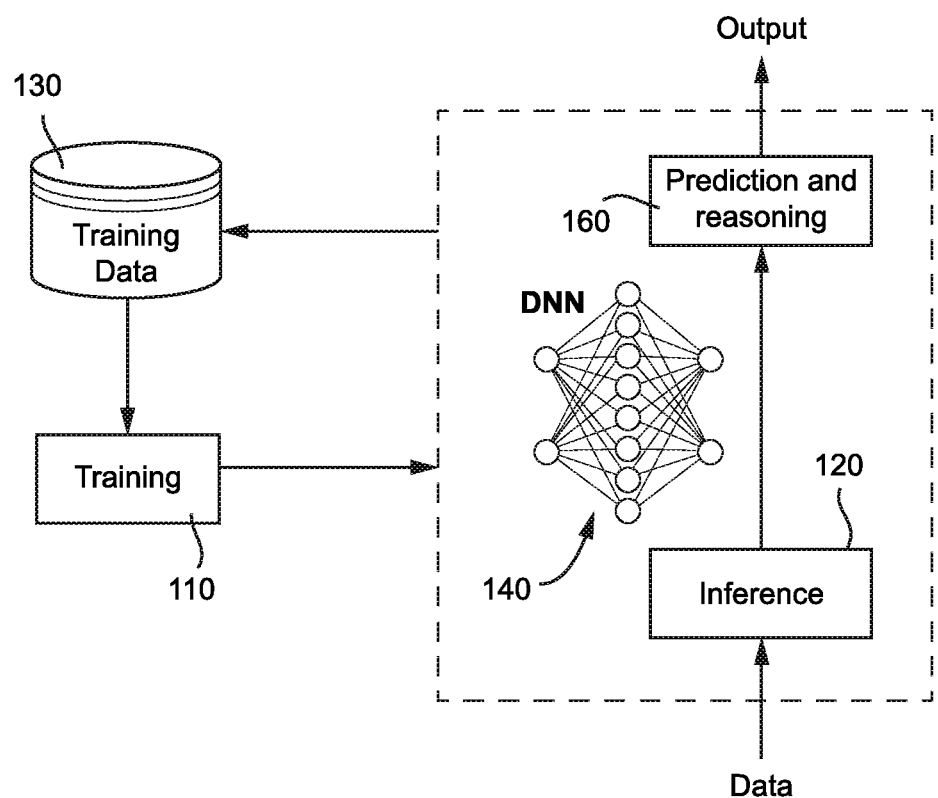
FIG. 1 is a block diagram of an example non-limiting deep neural network.

By using a generalizable optimization of examining the data prior to compressor invocation, the example non-limiting technology herein makes it possible to tune a compressor to better target the incoming data. For sparse data compression, this step may involve examining the distribution of data (e.g., in one example, zeros in the data). For other algorithms, it may involve other types of inspection. This is not simply a preprocessing or "priming-the-pump" step, as it changes the fundamental behavior of the compressor itself. An alternate solution would be to instantiate multiple copies of the compressor with slightly different configurations, but this is less optimal from an area and energy standpoint.

Additionally, by inspecting the distribution of data (e.g., zeros in the data), it also possible to very accurately predict the data width of the underlying data. This is useful because this data type is not always known a priori, and lossy compression algorithms, including but not limited to those useful for deep learning, depend on knowing the true data type to achieve good compression rates without catastrophic results.

Machine learning applications, such as deep learning applications utilizing artificial neural networks, store and transfer large volumes of data. The data is compressed and decompressed to reduce system storage and/or communication resources. The type of data and/or the layout of the data may not be provided with the data. Because the type of data is not known in these situations, it is not known how to best tune a generic data compressor. In addition, as will be discussed in more detail below, configuring the data compressor based on the data type may not provide the best compression results. To reduce area, latency, and/or complexity, embodiments of this disclosure consider the distribution of the data to determine the data type and/or the compressor configuration. For example, a sparse data compressor is included in a system processing neural network data because deep learning workloads can include very sparse data.

Example Context

It is often advantageous for a data compressor to operate in situations where the compressor is not told the data type of the data to be compressed and/or to optimize compression even when compression mode could be selected based on a declared data type.

Some embodiments herein determine how to compress and decompress a data set (such as a sparse neural network data set) based on determining a distribution of the data in the data set and using the determined distribution to infer a data type and/or format and thus select an appropriate or optimal data compression algorithm Embodiments herein provide systems and methods to decide on an optimal compressor and decompressor mode/configuration, and determine the underlying data type, in a single read-only pass over the input data set or a subset of the input data set.

For example, the preponderance of zeros (or some other data characteristic/occurrence) in the input data set can be used to configure or select a mode of the data compressor. As one example, by inspecting/detecting the distribution of zero (or other) bytes and gathering some basic statistics, the optimal configuration for the compressor can be determined for every input. Further, a small addition to this basic pass will result in a very accurate determination of the true underlying data type (which may not be the same as a declared data type), which can be useful for lossy and other compression techniques.

The example non-limiting techniques herein are flexible, offer a complexity-optimality tradeoff, and are simple and cheap to realize in hardware (e.g., in a GPU or CPU L2 cache). They do not require entropy coding as a post-processing step. Further potential advantages include reduced memory (DRAM) bandwidth/power, and enabling (without requiring) lossy compression for deep learning and other applications. In addition, the systems and methods disclosed in this application reduce valuable hardware space, power consumption, latency, and/or system complexity.

In a non-limiting example, a data compressor includes a processing circuit configured to inspect a neural network data set to detect a distribution of data, infer a granularity of the neural network data set based on the detected distribution of data, and compress the neural network data set using the inferred granularity. The data compressor may be configured to determine the data type of the neural network data set based on the detected distribution of data. The data type may be used to modify the neural network data set and/or determine what compression should be applied.

In another non-limiting example, a data compressor includes a processing circuit configured to inspect a subset of a neural network data set to detect a distribution of data, infer an element size of the neural network data set based on the detected distribution of data, and compress the neural network data set using the inferred element size.

In another non-limiting example, statistical analysis of distribution of zeros (or ones) in the data is used to determine a granularity to use for compressing the data. The compression may include removing redundant data values grouped with the determined granularity (e.g., a run of zeros or a run of ones of a certain run length) and using e.g., a mask or other technique to represent the removed data values. The distribution of the data (e.g., runs of zeros or runs of ones) may also be used to determine, with high accuracy, the true data type. The data type may be used to modify the data (e.g., before compression) and/or determine compression schemes (e.g., lossy compression) to be applied to compress the data.

Further, unlike some existing compression approaches (e.g., entropy coding or run length coding) which require the complete set of data for compression to be analyzed before compression is performed to approach optimal performance, the example non-limiting systems and methods disclosed in this specification allow for optimal compression to be quickly determined by analyzing a subset of the input data set to be compressed, where the size of the subset is less than (or equal to) the size of the input data set. As one example, the subset to be analyzed can be a relatively small part of the input data set such as the first 32 bytes of a 256-byte data set.

Some Challenges Faced with Configuring Data Compressors for Different Data Types Modern data processing systems are often not limited to using just one data type. Different data types may be used to perform operations depending on the application and stage of processing. In one example, a different number of bits or bytes may be used to represent numerical or other values with different precisions at different stages of a process.

In deep learning, for example, FP32 (single precision floating-point), FP16 (half precision floating-point), INT8 (8-bit integer data), and even FP64 (double precision floating-point) data types may be used at different phases or stages. FP32 and FP64 data types offer a large range and high precision but are also expensive formats requiring 32 and 64 bits per numerical value, respectively. When higher precision can be sacrificed (e.g., during some aspects of training and inference), using more compact data representations such as FP16 or INT8 can reduce memory usage and data transfer latency—resulting in considerable increases in processing speed and efficiency. See e.g., Clark, "Accelerating GPU computation through mixed-precision methods", http://www.nvidia.com/content/PDF/sc_2010/CUDA_Tutorial/
SC10_Accelerating_GPU_Computation_Through_Mixed-Precision_Methods.pdf FIG. 1 illustrates an example non-limiting deep learning process. Deep learning may have two main processing stages: training 110 and inference 120. Different phases of training 110 and/or inference 120 may be performed on the same or different hardware. In one example, the inference 120 may be performed in the field on a deep neural network (DNN) 140 implemented in a production environment such as a data center, an automobile, or an embedded platform.

During the training stage 110, the DNN 140 learns from training data 130. Weights of the DNN 140 are adjusted to recognize patterns in the training data 130. Training 110 includes iterative forward and backward passes through the DNN 140 as the objective function is minimized with respect to the weights of the neural network. Training 110 may continue until the accuracy of the DNN 140, validated against test data, reaches a desired level.

During inference 120, a trained DNN 140 makes predictions and applies reasoning 160 for input data. The trained DNN 140 may provide, by way of non-limiting example, image or pattern recognition, object detection, segmentation, image registration, depth from raw stereo, signal analytics or any of a wide variety of other predictive or other processing that can benefit from neural networks. Results of the inference 120 may be provided back to training 110 to further train the DNN 140.

Because of the vast number of computations needed to train DNN 140, it may be attractive or efficient to switch to (whenever possible) lower precision data types that increase efficiency of memory and data transfer bandwidth. For example, some phases of training 110 (e.g., forward propagation) may be performed using lower precision numerical representations such as FP16 or INT8. Other parts of training 110 (e.g., backward propagation) may on the other hand benefit from higher precision representations such as FP32 or even FP64.

Higher precision floating point representations used by iterative training 110 may not be needed after DNN 140 is trained. Precision provided by more compact data types (e.g., FP16 or INT8) may be sufficient to perform non-iterative inference 120 related operations using the already-trained DNN 140. The same hardware and processing may thus encounter different data types and formats within a neural network data stream (see FIG. 1A). Additionally, due to the massive amount of data required to train DNN 120, substantial memory and bandwidth savings can be achieved by using data representations that do not decorate the DNN data with type-indicating metadata. Further, the same buffers may be re-used for multiple purposes without this being exposed to the hardware or software responsible for these buffers, depending on what the programmer decides is necessary.

To further increase storage capacity, decrease memory latency and reduce amount of data that is transmitted at various phases and stages of processing the data, it is desirable to compress and decompress the data. As one example, it is helpful to include a data codec (compressor/decompressor) in the (e.g., L2) cache of the processing system to compress (in hardware) before saving to memory, and decompressing (again in hardware) upon retrieval from memory for further processing.

The type of data being compressed and the required accuracy and precision of the data needed after decompression can be used to determine which type of compression to apply to the data.

In deep learning applications, the data may have a high rate of sparsity (e.g., a preponderance of zeros or ones in binary data). The high rate of sparsity may be in either the data representing the deep learning network itself or the data flowing through the network. The presence of many zeros or ones in the data has prompted corporations and academia to look at the zeros in different ways to exploit them. One approach is to compress the data by removing essentially all the zeros or all the ones from the data, such that, when the data is fetched, less data needs to be transferred. With this approach, the compressed data may include patched together non-zero (or non-one) data and data that keeps track of where the zeros (or ones) were before they were removed. A simple way to keep track of the removed zeros or ones is with a bitmask, where each bit in the bitmask represents an element in the data.

Sparse Data Compression

Suppose a particular implementation has hardware within an L2 cache that will support a sparse data compression and decompression algorithm which targets data with a majority of 0's. By storing (1) information about which data elements are non-zero, and (2) these nonzero data elements, the storage required by the data can often be reduced by (at least) half An example of this format for a group of 8 int8 (1B) values is shown in Table I below:

TABLE 1

| Uncompressed, 8B: | | | | | | | |
|---|---|---|---|---|---|---|---|
| 0xab | 0x23 | 0x00 | 0x00 | 0x00 | 0x00 | 0xf4 | 0x00 |

Given the sparseness of the data and the number of zeros, it is possible to use a data mask to indicate the locations of zeros in the data set and then represent only the nonzero values, as shown in Table II below:

TABLE II

| Compressed, 4B:<br>(1) 1B of mask data: 0b11000010<br>(2) 3B of nonzero elements: | | |
|---|---|---|
| 0xab | 0x23 | 0xf4 |

Here, the mask data thus specifies 8 bytes (each byte corresponding to a bit in the mask). The "1" values in the data mask indicate non-zero values in the input data block, and "0" values indicate zero values. Only the non-zero values are explicitly stored or transmitted to the decompressor. (The decompressor is able to populate the zero values based on the bit mask alone.)

Importance of Proper Data Type Selection

Figure 1A:
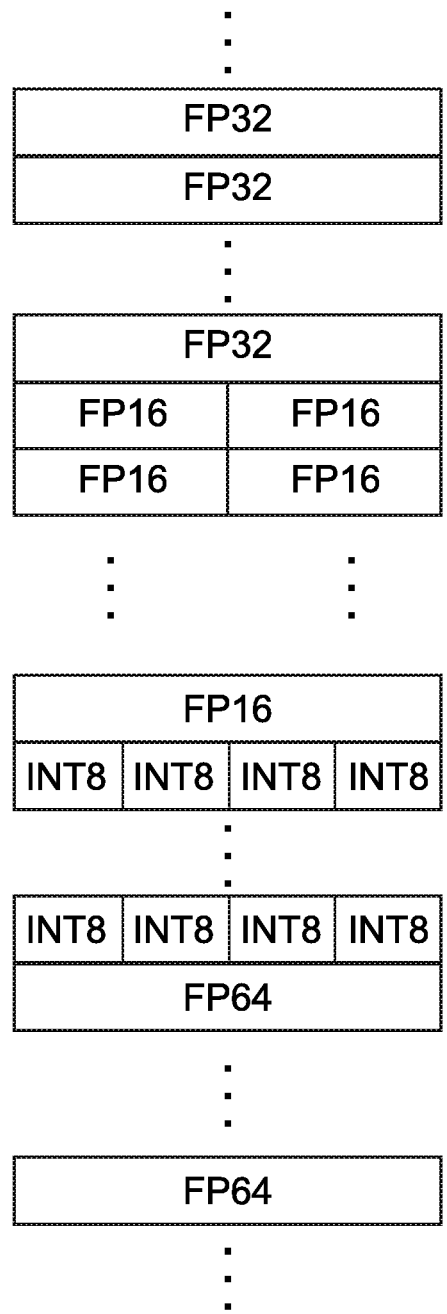
FIG. 1A shows an example non-limiting deep neural network data stream including different data types.

As FIG. 1A shows, different data types may be present in data sets associated with deep learning and other applications. While given compression and decompression techniques may provide good compression results for some data, other compression techniques may be needed for other data types. Thus, it is often helpful to determine what kind of compression will achieve more optimal results for the current data type. Even more interestingly, the grouping or distribution of zeros in a sparse data set may—independent of any particular data type—correlate with the optimum size of input blocks or "chunks" the data compressor and decompressor should operate on.

For example, if a compressor is used to remove zeros from the data, it is helpful to decide on a "granularity" or size of the data used to define e.g., a mask. The packing granularity of the data may determine the length of each element being substituted by a mask representation and if a mask is used, the size of the mask (e.g., how much data is represented by each entry in the mask).

One approach is to determine the packing granularity based on the data type of the data, which in some cases may be provided in a tag or other metadata with the data. Consider the sixteen FP32 values in Table 3 below.

TABLE 3

| Uncompressed, 64B: | | | | | | | |
|---|---|---|---|---|---|---|---|
| 54.2130f | 54.2131f | 0.0f | 0.0f | 0.0f | 0.0f | 54.2132f | 0.0f |
| 0.0f | 0.0f | 54.2133f | 54.2134f | 54.2135f | 54.2136f | 0.0f | 0.0f |

Using the same technique above with one bit in the bitmask standing for (representing) each byte in the data (each FP32 numerical value being represented by four bytes), the compressed data may be provided by the following in Table 4:

(1) 8B of mask data: 0b11111111, 0b00000000, 0b000000000, 0b11110000, 0b00000000, 0b11111111, 0b111111111, 0b00000000; and
(2) 28B of nonzero elements (four "1's" in the bitmask representing the four bytes of each non-zero element):

| 54.2130f | 54.2131f | 54.2132f | 54.2133f | 54.2134f | 54.2135f | 54.2136f |
|---|---|---|---|---|---|---|

This results in 36B of compressed data (28B+8B=36B), or more than half of the 64B (the size of the original uncompressed data set). In many architectures, a compression rate of 2:1 is the minimum rate necessary for compression to be useful for a block of data. So a compression result of 36B for this data set is in some applications no better than uncompressed 64B data due to the overhead of compressing/decompressing, memory atom size, or granularity of storage in memories.

If instead, FP32 data should use a bitmask in which each bit in the bitmask stands for (is used to represent) each FP32 value (or 4B of data), the final compressed size is only 30B as shown in Table 5 below:

TABLE 5

(1) 2B of mask data: 0b11000010, 0b00111100; and
(2) 28B of nonzero elements:

| 54.2130f | 54.2131f | 54.2132f | 54.2133f | 54.2134f | 54.2135f | 54.2136f |
|---|---|---|---|---|---|---|

This will result in 30B (2B+28B=30B) of compressed data, which is less than half of the original data, and better compression as compared to using one byte granularity for the bitmask. Thus, matching the granularity of the compression algorithm with the underlying data type may provide improved compression.

Conversely, consider compressing the original int8 data with the bitmask granularity of fp32 data:

TABLE 1

(repeated)
Uncompressed, 8B:

| 0xab | 0x23 | 0x00 | 0x00 | 0x00 | 0x00 | 0xf4 | 0x00 |
|---|---|---|---|---|---|---|---|

TABLE 6

Expressed as 4B data elements, still 8B uncompressed:
0xab230000         0x0000f400
Compressed, >8B:
(1) 2b of mask data: 0b11
(2) 8B of nonzero elements:
(3) 0xab230000         0x0000f400

So, it is important to match the bitmask granularity with the underlying data type.

Optimal Mask Granularity

There are cases where it may not be best to match the data type with the bitmask granularity. For instance, consider these 64 int8 data elements, 64B uncompressed:

TABLE 7

| 0x01 | 0x23 | 0x45 | 0x67 | 0x89 | 0xab | 0xcd | 0xef |
|---|---|---|---|---|---|---|---|
| 0xfe | 0xdc | 0xba | 0x98 | 0x00 | 0x00 | 0x00 | 0x00 |
| (0x00 . . .) | | | | | | | |
| 0x00 | 0x00 | 0x00 | 0x00 | 0x00 | 0x00 | 0x00 | 0x00 |

Compressing using a 1B bitmask will result in:

TABLE 8

(1) 8B of mask data: 0b11111111, 0b11110000, . . . , 0b00000000
(2) 12B of nonzero elements:

| 0x01 | 0x23 | 0x45 | 0x67 | 0x89 | 0xab | 0xcd | 0xef |
|---|---|---|---|---|---|---|---|
| 0xfe | 0xdc | 0xba | 0x98 | | | | |

Compressing the same data set using a 4B bitmask instead gives only 14B of compressed data, allowing the block to use a 4:1 compression mode:

TABLE 9

(1) 2B of mask data: 0b11100000, 0b00000000
(2) 12B of nonzero elements:

| 0x01 | 0x23 | 0x45 | 0x67 | 0x89 | 0xab | 0xcd | 0xef |
|---|---|---|---|---|---|---|---|
| 0xfe | 0xdc | 0xba | 0x98 | | | | |

So, merely matching the bitmask granularity with the underlying data type can be suboptimal. Even if the data type is known, the data type may not always be a good indication of the granularity for the optimal compression. Rather, the actual distribution of the zeros is more telling of what kind of granularity should be used in compressing the data.

Example non-limiting implementations herein look at the distribution of zeros (or ones) in the data to determine the data type and/or the granularity for compressing the data.

Example Non-Limiting Method for Compressing Data

Figure 2:
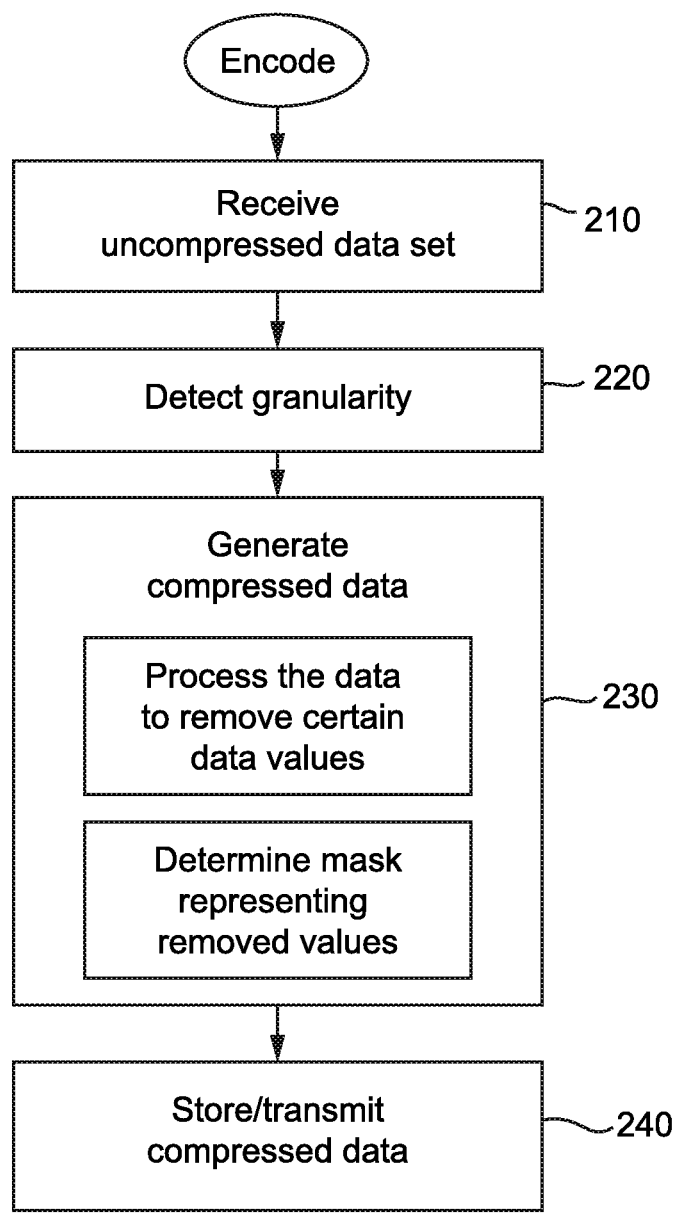
FIG. 2 is a flowchart of an example non-limiting data compression method that infers granularity for compression based on inspection of data distribution.

FIG. 2 illustrates an example non-limiting method 200 for compressing data. The method may be performed by a hardware-based processing circuit of a data processor cache memory, but is not so limited.

The method includes receiving an uncompressed data set for compression 210. The received data set may be a neural network data set. In one non-limiting embodiment, the data set may be binary data. The data set may or may not include an identification as to the type(s) of data representations (e.g., INT8, FP16, FP32, or FP64) within the data set.

The compression method inspects the received data set to detect or infer a granularity to be used to compress the data set 210. The granularity may be inferred based on the distribution of data in the data set. The granularity may be inferred by analyzing a subset of the received data set. The granularity may be selected from a plurality of possible granularities. The granularity may be selected based on the distribution of element values (e.g., zero valued bytes) in all or a subset of the received data set.

The compression method 200 compresses the received data set using the inferred granularity 230. In one example, the data set may be compressed by removing successive or singular (depending on the granularity) elements, with zero (or one) values, from the received data set and instead representing them with a compression mask representing each element in the received data set and indicating which elements in the received data set have zero (or one) values. The compressed data can be stored in memory and/or transmitted to a device requesting the compressed data 240. A different compression granularity may be applied to successive data in the same data set due to differences in the distribution of data in each data set.

Figure 3:
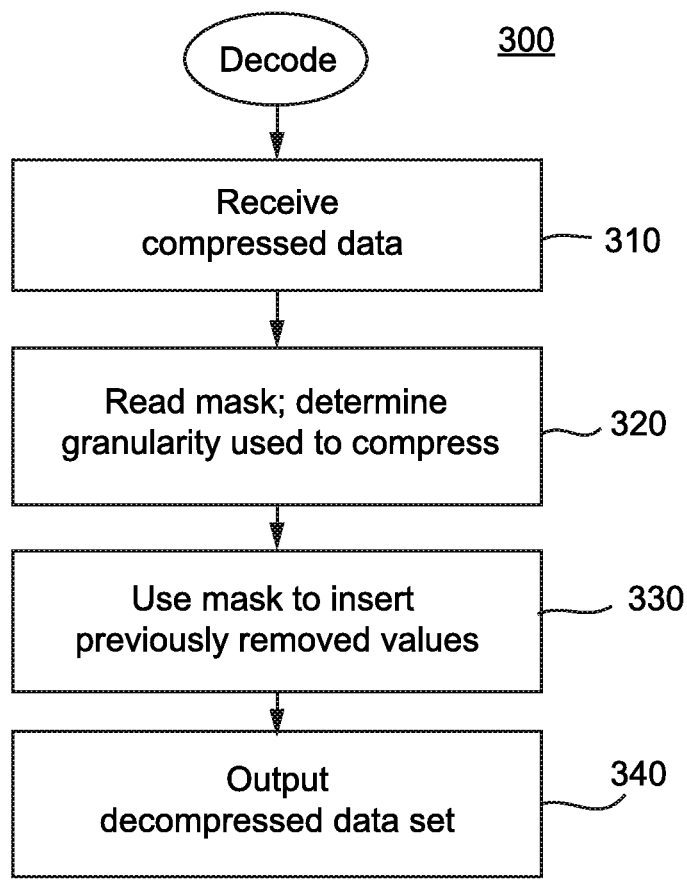
FIG. 3 is a flowchart of an example non-limiting data decompression method.

FIG. 3 shows an example non-limiting decompression method 300 used to decompress the data compressed by the FIG. 2 compression method 200. As with the compression method 200, the decompression method 300 by be implemented in hardware in an L2 cache of a GPU or other processor, although the implementation is not so limited.

In this example, the decompression method 300 receives the compressed data from the compression method 200 (block 310). The compressed data set may have been stored in main memory, may have remained resident in the L2 cache, or may have been transmitted between processors. In the example shown, the decompression method 300 reads the mask generated by compression method 200 and determines the inferred granularity that the compression method 200 used to compress the data. This inferred granularity is typically explicitly or implicitly transmitted from the compression method 200 to the decompression method 300, e.g., as metadata or side information. It may or may not be embedded in the compressed data itself, depending on the application.

Once the decompression method 300 knows the granularity used by the compression method 200 to compress the data, it uses the mask to insert redundant values (e.g., zeros or ones in the case of binary representations) into positions in the output data as specified by the mask. As an example, if the mask indicates a "1", the decompression method 300 will insert the next non-zero value explicitly provided by the compression method 200. On the other hand, if the mask value is "0", the decompression method 300 will insert one or a succession of zeros—with the length of the zero run being determined by the granularity used to compress the data. Once the decompression method 300 has parsed the entirety of the mask and has constructed all successive bytes in the output data based on the mask, the decompression method 300 outputs the decompressed data set (e.g., by storing it in the L2 cache and thereby making it available to the processor).

Example Non-Limiting Methods for Selecting the Granularity

Figure 5:
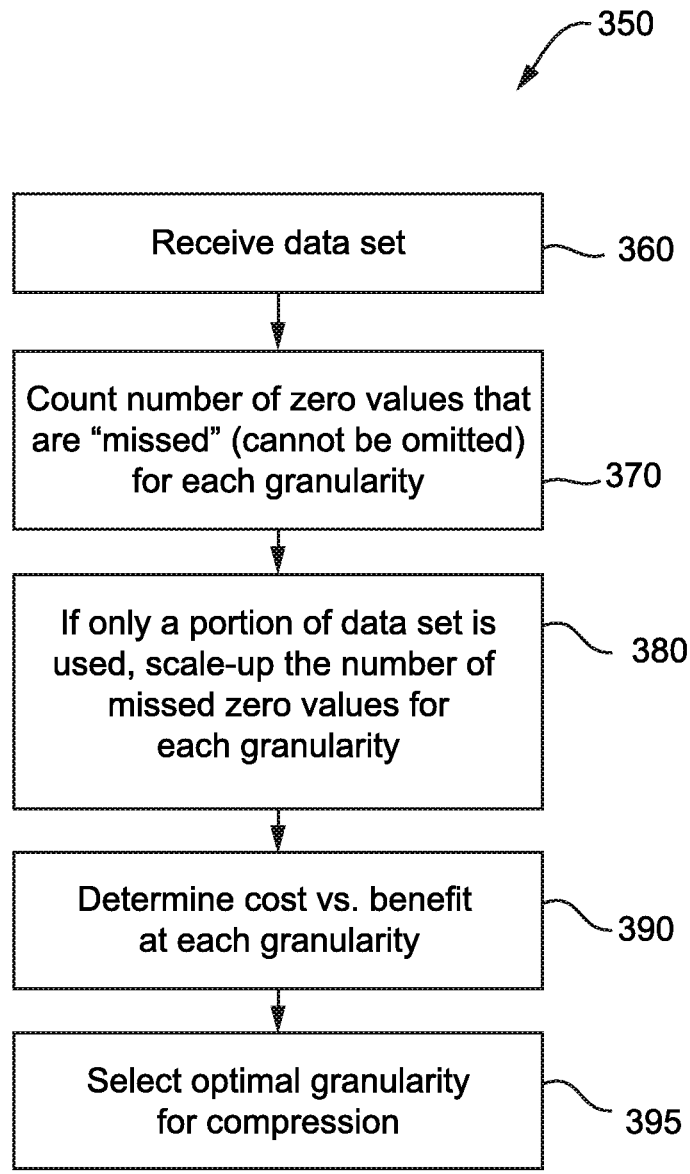
FIG. 5 is a more detailed flowchart that shows an example non-limiting method for determining optimal compression granularity.

FIG. 5 illustrates an example non-limiting method 350 for selecting the granularity for compressing data. The method looks at the distribution of data (e.g., successive values in the data having a zero value) to determine a granularity, from of a plurality of possible granularities, that should be used for compressing the data.

The method 350 includes receiving data to be compressed 360. In one embodiment, only a subset of a data set to be compressed is used to determine the granularity for compressing the entire data set. The subset of the data that is used to determine the granularity for the compression may be the amount of data that can be conveniently stored in a buffer and operated on efficiently by a hardware processor. The subset of the data used to determine the granularity can be e.g., 16 bytes or 32 bytes of a 256 byte data set in one example.

Next, the subset of the data is scanned to determine the number of zero values (e.g., zero bytes) that are "missed", i.e., will not be removed for each possible granularity 370. As an example, if the smallest granularity is one byte and other possible granularities are two bytes and four bytes, the subset of input data is scanned to determine the number of zero bytes that will be missed (e.g., would not be removed from the data) during the compression if two byte granularity is used and the number of zero bytes that will be missed during the compression if four byte granularity is used. This process may look through the data four bytes at a time, counting the number of zero bytes that would be missed for two byte granularity and four byte granularity.

There is no need to determine the number of zero values that will be missed for one byte granularity because, for compression with one byte granularity, every zero byte in the data will be removed from the received data. For compression with a granularity of two bytes, only two successive bytes that each have a value of zero with certain alignment are removed; a byte with a zero value will not be removed if the other byte in the two byte element is a nonzero value. For compression with a granularity of four bytes, only four successive bytes that each have values of zero with a certain alignment are removed and no bytes with a zero value will be removed if there is at least one nonzero value in the four byte element.

Next, if only a subset of the data is scanned to perform the determination in step 370, the number of missed zeros can be scaled up for each granularity 380. As an example, if only a subset of the data in the buffer is used to determine the number of zero bytes that will be missed by the two byte granularity and the four byte granularity, the number of zero bytes that will be missed by each granularity may be multiplied by a scaling factor to estimate the total number of zero bytes that will be missed if all of the data is compressed with the each granularity. The scaling factor can be the size of the total data (e.g., size of the buffer) divided by the size of the scanned data. Alternatively, the missed zeros can be compared to the scaled-down entire buffer cost; scaling up is not the only way to adapt to sub-sampling.

Next, the cost versus benefit of compressing using each granularity is determined (390). In this step, a comparison is made between opportunity that is lost to remove bytes of zeros from the received data and the benefit that is provided by using the larger granularity. By using a larger mask granularity, bytes are saved because a smaller bitmap can be used, but at the same time there is potential to miss more zeros and thereby increase the size of the nonzero data elements by increasing the granularity.

For example, if four-byte granularity is applied, a mask of 8 bits will represent 32 bytes of input data. If one byte granularity is applied to the same 32 bytes of input data, a mask of 32 bits will be required, which increases the bitmask length by three bytes. In this example, if the number of zero bytes that would be missed for a four byte granularity is under three (increase in the size of bitmask), then there would be a benefit in using a four byte granularity over the one byte granularity even though there may be some "missed" zero bytes in the compressed data.

The benefit provided by two byte granularity (2B vs. 4B) and four byte granularity (1B vs. 4B) for data in a buffer may be determined by:

Benefit2$B$=2*(buffer size)/32-zeros_missed2$B$.

Benefit4$B$=3*(buffer size)/32-zeros_missed4$B$.

The 2*(buffer_size)/32 value above represents the number of bytes that are saved when each bit in the mask represents two bytes. The 3*(buffer_size)/32 value represents the number of bytes that are saved when each bit in the mask represents four bytes. These values are compared to the number of zero bytes that are missed for each of these granularities.

The granularity that provides the most benefit is selected for the compression 395. If no benefit is provided by using two byte granularity or four byte granularity, then one byte granularity is selected for the compression. Otherwise, the two byte granularity or the four byte granularity with the higher benefit value is selected for compression.

Figure 5A:
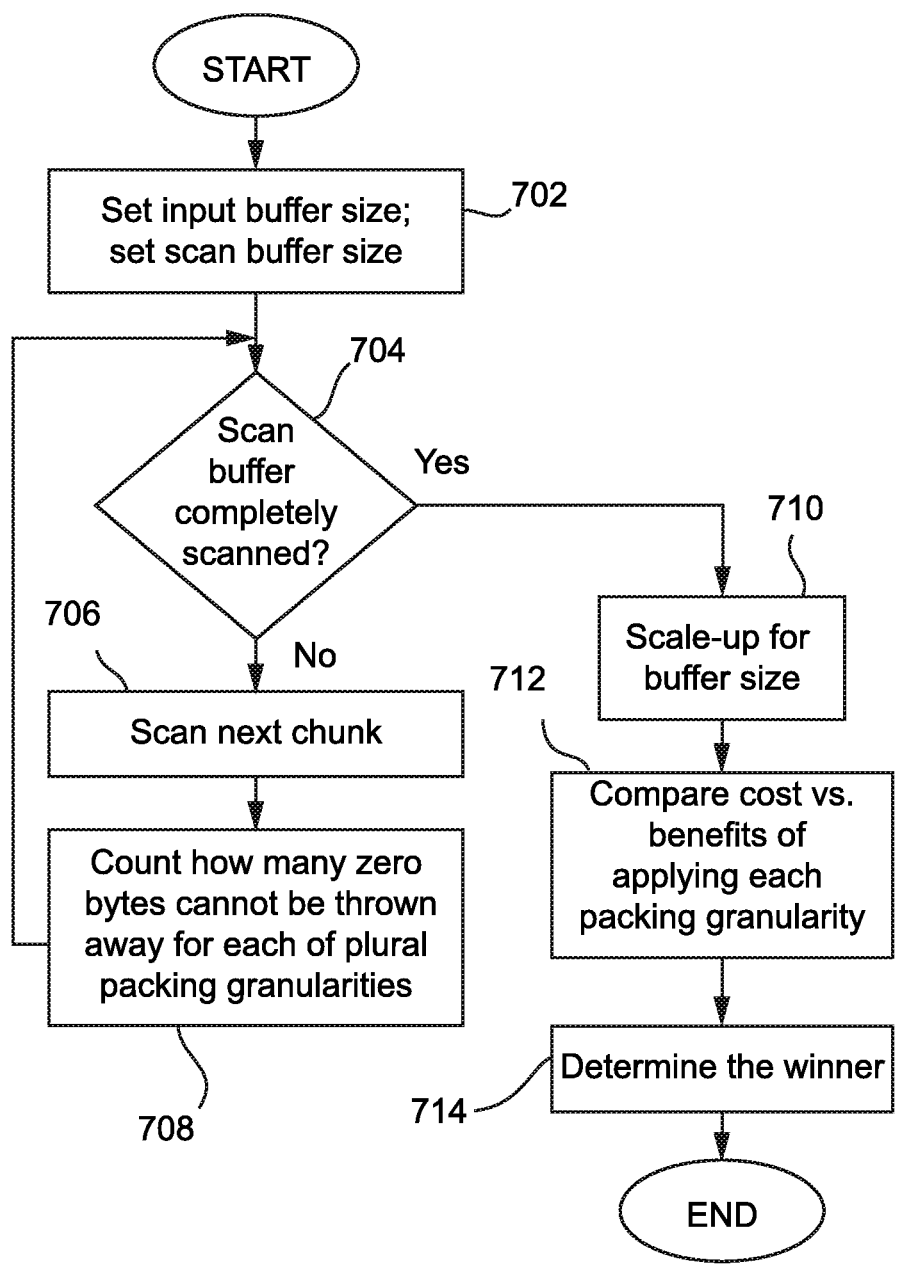
FIG. 5A is a still more detailed flowchart showing an example non-limiting method for determining optimal compression granularity.

FIG. 5A shows an even more detailed hardware-based algorithm that can be used to implement the granularity selection of FIG. 5. In this example, the hardware circuit selects an input buffer size and a scan buffer size (block 702), where these two values may or may not be the same. As described above, it may be efficient to only scan a relatively small subset of the input buffer size in order to estimate the data distribution of the entire input buffer contents. Generally speaking, input data usually tends to have coherence so that the data distribution characteristics of one part of the input buffer are likely statistically speaking, to be similar to the data distribution characteristics of other parts of the input buffer. This is not always the case, but it is correct often enough that good results can be obtained by saving the time and complexity to scan the entire input buffer and instead just parse a small subset (with the size of the subset being large enough to be statistically likely to be representative of the rest of the input buffer).

The hardware implementation then loops through the scan buffer (decision block 704), parsing each successive chunk in the scan buffer to count how many zero bytes cannot be thrown away for each of plural packing granularities (block 706, 708). Any number of different packing granularities may be evaluated at the same time although in one desirable implementation the packing granularities could comprise 1B, 2B, 4B. Advantages of evaluating each one of the plural packing granularities through a single pass of the scan buffer include efficiency and reduced latency.

Once the scan buffer has been completely parsed and a total count of how many zeros will be "missed" for each of the plural packing granularities is tallied, the hardware implementation scales these counts (block 710) based on the ratio between the input buffer size and the scan buffer size to estimate and predict the total number of zeros that will be "missed" for the entire input buffer based on each of the plural packing granularities evaluated at block 708. Then as described above, the hardware circuit compares the cost versus the benefit of applying each packing granularity (block 712) based on the trade-off between increased mask length and the number of zeros missed. As explained above, as the mask length increases due to smaller packing granularities, fewer zeros will be missed at a cost of increasing the mask length. Larger packing granularities result in decreased mask lengths, but at a cost of an increased number of missed zeros. The FIG. 5A hardware circuit implementation logic determines the winner (block 714) for that particular input buffer and outputs the selected packing granularity to the compression circuit to thereby select the compression circuit granularity mode.

A software function (which could be stored in non-transitory memory and executed by a processor or converted to HDL and implemented in hardware) for selecting the granularity between one byte, two byte, and four byte granularity according to a non-limiting exemplary embodiment can be provided by:

```
uint SDC::detect_unit(const unsigned char* buffer,
            const uint buffer_size,
                uint scan_size)
{
  // see if there is benefit from moving to 4B or 2B unit size
  uint four_byte_missed_0s = 0;
  uint two_byte_missed_0s = 0;
  assert((buffer_size / 4) * 4 == buffer_size);
  scan_size = std::min(scan_size, buffer_size);
  // count zeros missed by larger units
  for (uint byte = 0; byte < scan_size; byte += 4) {
    unsigned char* quad = &buffer[byte];
    // 2B misses
    if ((quad[0] == 0 && quad[1] != 0) || (quad[0] != 0 && quad[1] == 0))
        two_byte_missed_0s++;
    if ((quad[2] == 0 && quad[3] != 0) || (quad[2] != 0 && quad[3] == 0))
        two_byte_missed_0s++
    // 4B misses
    uint numZeros = 0;
    for (uint b=0; b<4; ++b) numZeros += quad[b] == 0;
    if (numZeros != 4) four_byte_missed_0s += numZeros;
  }
  // if scanning only part of the buffer, scale up
  four_byte_missed_0s *= (buffer_size / scan_size);
  two_byte_missed_0s *= (buffer_size / scan_size);
  // save bytes by using a larger mask granularity,
  // but penalized for missing 0s
                 // B of mask per 32B?
  int four_byte_benefit = 3 * (buffer_size / 32); // 1B vs. 4B
  int two_byte_benefit = 2 * (buffer_size / 32); // 2B vs. 4B
  four_byte_benefit -= four_byte_missed_0s;
  two_byte_benefit -= two_byte_missed_0s;
  // determine the winner
  uint unit = 2;
  if (four_byte_benefit < 0 && two_byte_benefit < 0) unit = 1;
  else if (four_byte_benefit > two_byte_benefit) unit = 4;
  return unit;
}
```

In one embodiment, the total number of bytes that are needed for the bitmask and the data of nonzero elements can be determined for each of several possible packing granularities and the mask granularity with the smallest total data size may be selected for the compression. The selection of the granularity may be performed based on only a subset of the data (e.g., a subset of the data in the buffer) and the selected granularity may be used to compress all of the received data in the buffer. The size of the mask for each granularity may be determined by dividing the data size (e.g., size of the buffer or subset of data used for the selecting of the granularity) by the respective granularity.

Having this detection available (i.e., determining the packing granularity for compression based on the analysis of the data distribution) can obviate the need for using multiple separate compressors (e.g., each compressor configured for a different data type), which can take non-trivial area in constrained layouts. In addition, by performing the detection on a subset of the data, rather than the entire chunk or data block to be compressed, the amount of buffering and latency is reduced, at the expense of possibly choosing a sub-optimal data type if the statistics of the first data are different from those of the latter data. In other words, choosing a sub-optimal granularity may occur in situations where the data distribution within the portion of the data used to determine the granularity is statistically different from the rest of the data. As illustrated below, in practice, using a subset of the data for detection approaches the optimal solution, and is remarkably better than a static assumption, as seen in FIG. 6.

Example Compression Results

Figure 6:
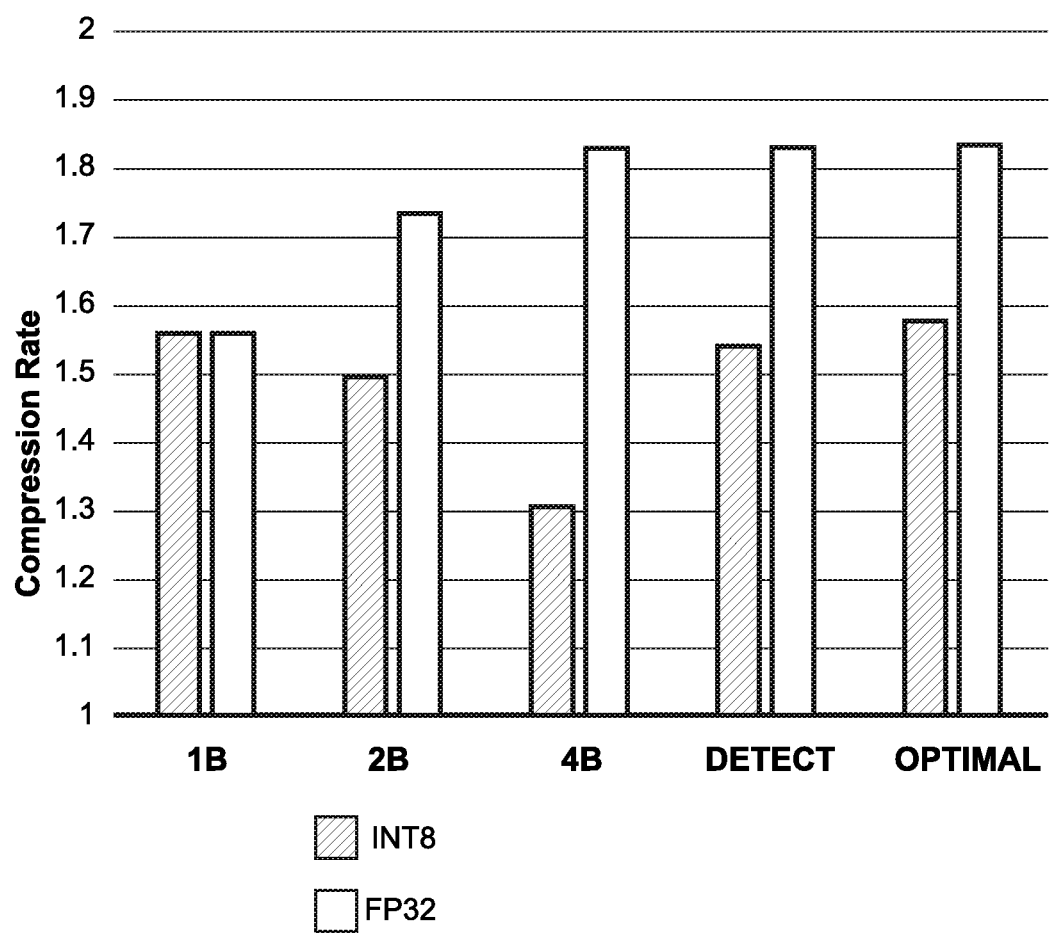
FIG. 6 graphically illustrates compression results showing advantages of choosing the proper data size (granularity) for compression.

FIG. 6 illustrates compression results using different techniques to determine the granularity for the compression. The graph illustrates compression results for data seen in the GoogLeNet network of both INT8 data type and FP32 data type. While the illustrated results are provided for specific data sets, similar results have been observed for other data sets.

In FIG. 6, results are shown for compressing a data set with one byte granularity (1B), two byte granularity (2B), four byte granularity (4B), automatically detected granularity based on a subset of data (DETECT), and optimal compression result determined by analyzing all of the data to be compressed (OPTIMAL).

FIG. 6 shows that when the data are FP32 values (non-crosshatched bars), the _4B compressor configuration (middle group) is far superior to the _1B (far left) or _2B configurations. Similarly, int8 data requires a _1B compressor configuration (far left) to achieve reasonable compression rates. Further, detecting ("detect") the appropriate configuration to use with only a subset (32B) of the entire data chunk (256B) is nearly as successful as matching the underlying data type exactly. Finally, choosing the optimal configuration for each 256B chunk ("optimal") is only slightly better than this detection scheme, but does improve performance over matching the data type exactly for the int8 case, for the reasons described in "Optimal mask granularity", above.

In more detail, the "1B" bars show compression ratio resulting from compressing INT8 and FP32 data with one byte granularity. The "2B" bars show results for two bytes granularity, and the "4B" bars show results for four bytes granularity. The "DETECT" bars show results for inspecting 32 bytes of each 256 byte input block to determine the best granularity for compressing each respective block of data and applying the selected granularity to compress each respective block of data. The OPTIMAL compressor configuration involves, for each 256 byte block of data in the data set, inspecting the entire data block to determine the best granularity to use.

The compression results of the 1B, 2B, and 4B packing granularities show that it is usually helpful to match the data type with the compression packing granularity. As expected, better compression results are provided for the INT8 data set when 1B packing granularity is used as compared to the 2B or 4B granularity. Similarly, as one might expect, better compression results are provided for the FP32 data set when 4B granularity is used as compared to the 1B or 2B granularity.

The compression results of the 1B and OPTIMAL configuration for the INT8 data set illustrate that merely matching the data type to the compression granularity may not always provide the best compression. The OPTIMAL configuration results show that better compression of the INT8 data set can be obtained if the granularity is selected for each block of data individually based on the detected distribution of zeros in that data block. The OPTIMAL configuration will select 1 byte granularity for most blocks of data but may determine that for some blocks two or four byte granularity will provide better compression.

FIG. 6 also illustrates that the DETECT compressor configuration for the INT8 and the FP32 data sets provides better results than some of the pre-set compression packing granularity configurations (e.g., 2B and 4B for the INT8 data set and 1B and 2B for the FP32 data set). In addition, the results of the DETECT compressor configuration provides similar results to the OPTIMAL compressor configuration. While the OPTIMAL compressor configuration may provide slightly better results for some data sets, the DETECT compressor configuration uses less time and/or hardware because only a portion of each block of data is inspected to determine the granularity for the entire block. Increasing the size of the portion of the data block that is used to determine the granularity will increase the confidence of the decision and provides results which approach the OPTIMAL compressor configuration results.

Example Non-Limiting Method for Detecting True Data Type

As seen above, the underlying data type is not always the proper choice for bitmask granularity to achieve the best compression ratio. Therefore, the choice that gives the best compression ratio cannot be assumed to be the true underlying data type. Instead, this can be more accurately determined with some extra statistics gleaned in performing the above detection function.

Figure 4:
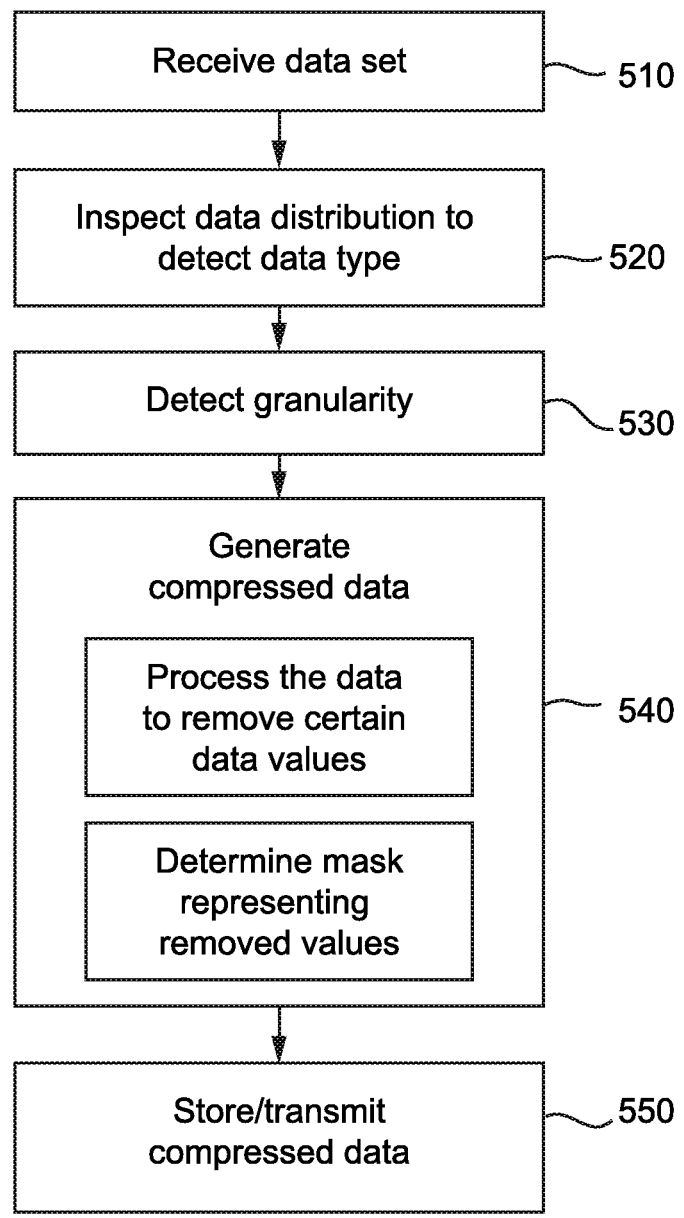
FIG. 4 is a flowchart of an example non-limiting data compression method that also analyzes data distribution to determine data type and granularity based on inspection of data distribution.

FIG. 4 illustrates an example non-limiting method for compressing data that includes identifying the true data type of the received data. The method may be performed by a processing circuit of a data processor, but is not so limited.

Identifying the data type of the input data according to the disclosed embodiments, may be beneficial when it is not possible to tag data sets with a data type. While this heuristic approach to determine the data type may not guarantee that the results are always accurate, the disclosed approach to detect the true data type is quick and provides the needed accuracy for many applications (e.g., deep learning).

The method includes receiving data for compression 510. The received data set may be binary data and may or may not include an identification as to the data type (e.g., INT8, FP16, FP32, or FP64) that is represented by the data.

The received data set may be analyzed to determine the data type 520 based on the distribution of data. The data type may be determined based on the distribution of zero and/or non-zero bits in the data set. The determination may include looking at the distribution of zero bytes to determine the data type. In one embodiment, the data type determination may be made based only a portion of the data.

The distribution of zeros in the data may provide a good indication of the underlying true data type. A key insight is that uniformly-distributed floating point data rarely contains multiple zero-bytes, particularly for deep learning workloads that rarely contain exact, round values like 1.0f (0x3f80000). Instead, the data often looks like this, as seen in the below excerpt of a hexdump of activations of one layer of an example DNN:

021dd70 5c96 3e55 86ea 3e66 080b 3e92 786e 3e80
    021dd80 9afd 3e23 0000 0000 0000 0000 c235 3dfa
    021dd90 b3c9 3eaa 7817 3ed1 583b 3eaf 2bb2 3e36
    021dda0 0000 0000 0000 0000 0000 0000 0000 0000
    021ddb0 ce32 3bc3 5c1b 3f21 9e1e 3f2c 99bb 3e87
    021ddc0 4e83 3e78 a1f8 3e3d 0000 0000 ce13 38f6
    021ddd0 c8de 3d6c 9379 3e3a 5a48 3e6d 853a 3e48

021dde0 968a 3dc8 0000 0000 0000 0000 0000 0000
021ddf0 0000 0000 2c7c 3d1a c558 3f13 32b2 3f1a Note that all zero bytes are contained within floating point fp32 0.0f values. This isn't guaranteed, though; of the hundreds of thousands of values in this layer's data, there exist only nine 0-bytes that aren't part of a 0.0f value. By mandating that there must be more than one such 0-byte that is by itself in a group of four bytes per compression chunk (128B), these false-positives can be avoided. A similar approach is possible to differentiate between fp16 and fp32/int8 data types by requiring two adjacent 0-bytes as indicating an FP16 value=0.

This detection feature could be useful in the deep learning domain, which could be amenable to lossy compression techniques. (HPC and graphics, which may have more round numbers, also more often demand "exact" results. Lossiness may not be tolerable for these domains.) By detecting the data type correctly, we can gracefully reduce the precision of the data, or throw away small values, etc., to meet a compression target. Without knowledge of the real data type, we could throw away bits that are more significant than we intended, if we accidentally for example treat an fp32 value as multiple int8 values.

In more detail, for FP32 data, the most common case is that if a zero byte is present, it is in a run of four zero bytes. If zeros are only present in a run of four zero bytes in the data, then it is very likely that the data type of the data is FP32. It could be that the data represents vectors of INT8 data, but it is very uncommon occurrence in deep learning.

For FP16 data, the presence of a zero byte likely means that one of the neighboring bytes is zeros (either the byte before or the byte after, depending on alignment).

For INT8 data type, a zero value is represented by a zero byte and adjacent byte values, in general, are not correlated with each other. Accordingly, the presence of a zero byte in INT8 data does not provide any indication of whether the adjacent byte will be zero or non-zero.

TABLE 10 lists distribution of zeros that can be associated with each data type (with the false-positive test discussed above). The received data set may be analyzed by counting the number of times each zero byte distribution is found in the received data set and the data type that is associated with the most commonly occurring zero byte distribution may be selected as the data type of the received data set.

TABLE 10

| INT8 | FP16 | FP32 |
| --- | --- | --- |
| Zeros occur in single bytes, i.e., a zero byte is followed and preceded by non-zero bytes | Zeros occur in pairs of adjacent zero bytes; non-zero floating point data rarely contains multiple zero-bytes | Zeros occur in runs of four zero bytes; Non-zero floating point data rarely contains multiple zero-bytes |

As discussed above, being able to determine the true data type as shown above could be useful in the deep learning domain, which could be amenable to certain types of lossy compression techniques.

Referring again to FIG. 4, the received data set may be analyzed to infer a granularity for the data set 530. The granularity may be selected such that it matches the data type. Alternatively, the granularity may be inferred based on the distribution of data in the data set.

Based on the determined granularity and the detected data type, compressed data is generated 540. The data set may be compressed by removing elements from the received data and representing the remaining non-zero elements with a compression mask.

In one non-limiting embodiment, the detected data type is used to select a way to compress the data. For example, the data type may be used to select between lossless and lossy compression.

As above, the data may be transformed by removing certain values that are not needed for an expected workload or by modifying the values that are represented by the data. For example, in deep learning a common operation is to throw away values that are below zero. This is a typical activation function used in convolutional networks called ReLU (a rectified linear unit). The result is that all the values that are negative are changed to zero. In other examples, very small values can similarly be changed (rounded down) to zeros without having a negative effect on the processing results. This can become a common source of sparsity in deep learning networks. Detected data type can inform which elements of the data represent values can be changed to zero, and thus thrown away during compression.

Knowing the data type may also allow for lossy compression methods to be used to compress the data set. Lossy compression techniques may allow some data to be lost while providing higher compression rates, which may be useful for deep learning or other workloads.

In other examples, the least significant bit may be removed for some data type (e.g., INT8). Knowing the data type is important in this case because removing the least significant bit of an INT8 value that is actually an upper byte of an FP32 value may remove an important part of the data.

Example Non-Limiting Processing System

Figure 7:
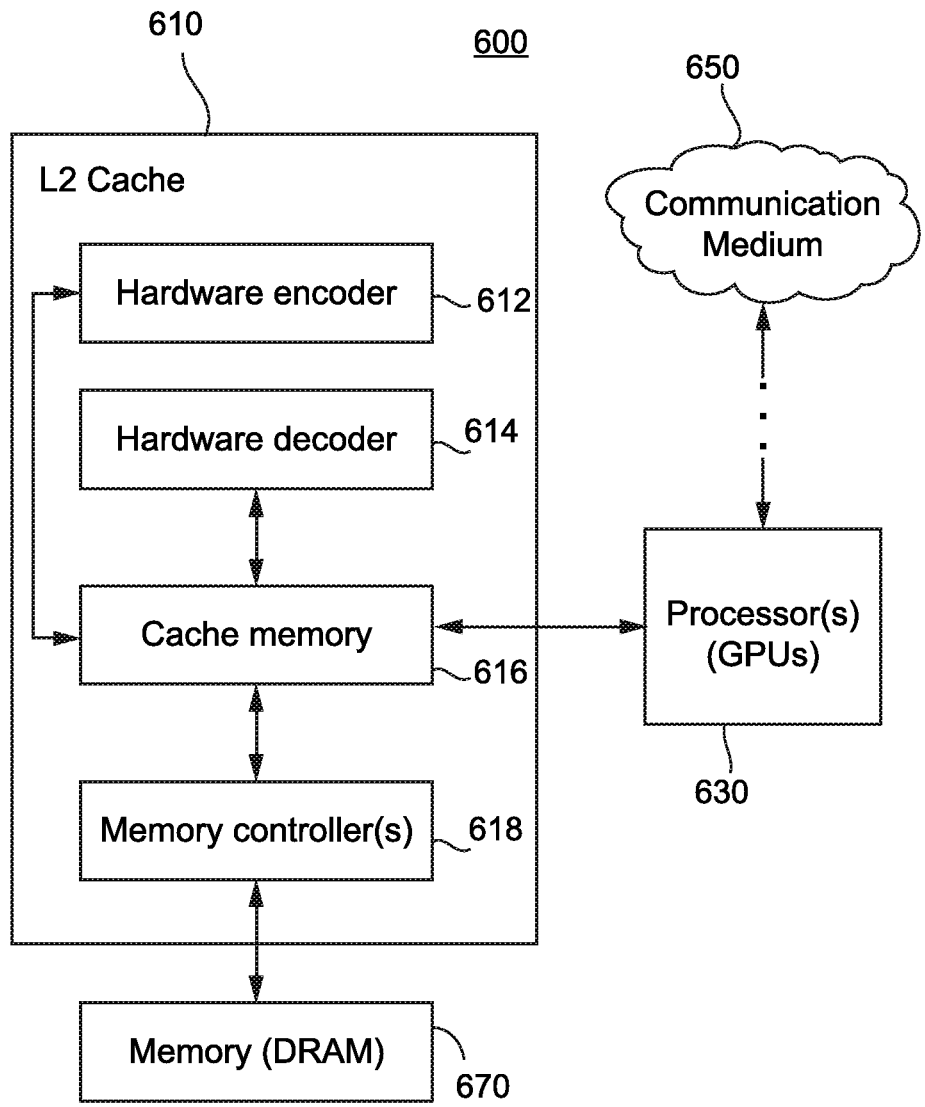
FIG. 7 is block diagram of an example processing system including a cache controller with a hardware encoder and decoder configured to determine the data type and granularity for compressing and decompressing data based on inspecting the data distribution.

FIG. 7 is a block diagram of an example processing system 600 including a cache controller 610 that automatically detects the true data type and/or packing granularity for compressing the data according to various embodiments disclosed in this specification. The processing system 600 may include a memory 670 and a data processor 630 such as one or more GPUs and/or one or more CPUs, and a cache controller 610.

The cache controller 610 may be any level cache (e.g., a level 1 (L1) cache, a level 2 (L2) cache, a level 3 (L3) cache, a mid-level cache (MLC) or a last level cache (LLC)) but in the example shown is an L2 cache. The memory 670 may store data and communicate with the data processor 630 and/or the cache controller 610 to receive and/or send data. In one embodiment, the memory 670 and the data processor 630 communicate via the cache controller 610. The memory 670 may be coupled to a memory controller 618 configured to perform operations for data transfers to and from the cache 610 and/or the data processor 630. The memory 670 may comprise DRAM, double data rate (DDRx) synchronous DRAM, or low power DDR (LPDDRx), but is not so limited.

The processing system 600 may be a multicore processing system comprising a GPU(s) and/or CPU(s), but is not so limited. The data processor 630 may include one or more central processing units (CPUs), which may have a single or multiple core design, and/or one or more application accelerator processors, or cores. The application accelerator processors may include specialized hardware accelerators for processing data intensive functions (e.g., video encoding and decoding).

The cache controller 610 may provide operations and functions for accelerating data transfers between the memory 670 and the data processor 630. In particular, the cache controller 610 may include an encoder 612 and a decoder 614 operatively coupled to a cache memory 616. The cache memory 616 may have one or more buffers allocated therein for use by the encoder 612 and/or decoder 614. The encoder 612 may be configured to compress data received from the data processor 630 and/or the memory 670. The compressed data may be stored in the cache memory 616 and/or transferred to the data processor 630 and/or the memory 670. A communication medium 650 may be an interconnection network or a bus system, and the processor 630 may transmit the compressed data over this network.

The decoder 614 may be configured to apply decompression operations to compressed data stored the cache memory 616. In some embodiments, the decoder 614 may be configured to decompress compressed data received from the memory 670 and/or the data processor 630. The data decompressed by the decoder 614 may be transferred to the memory 670 and/or the data processor 630, or stored uncompressed back to the cache memory 616, as shown.

Figure 7A:
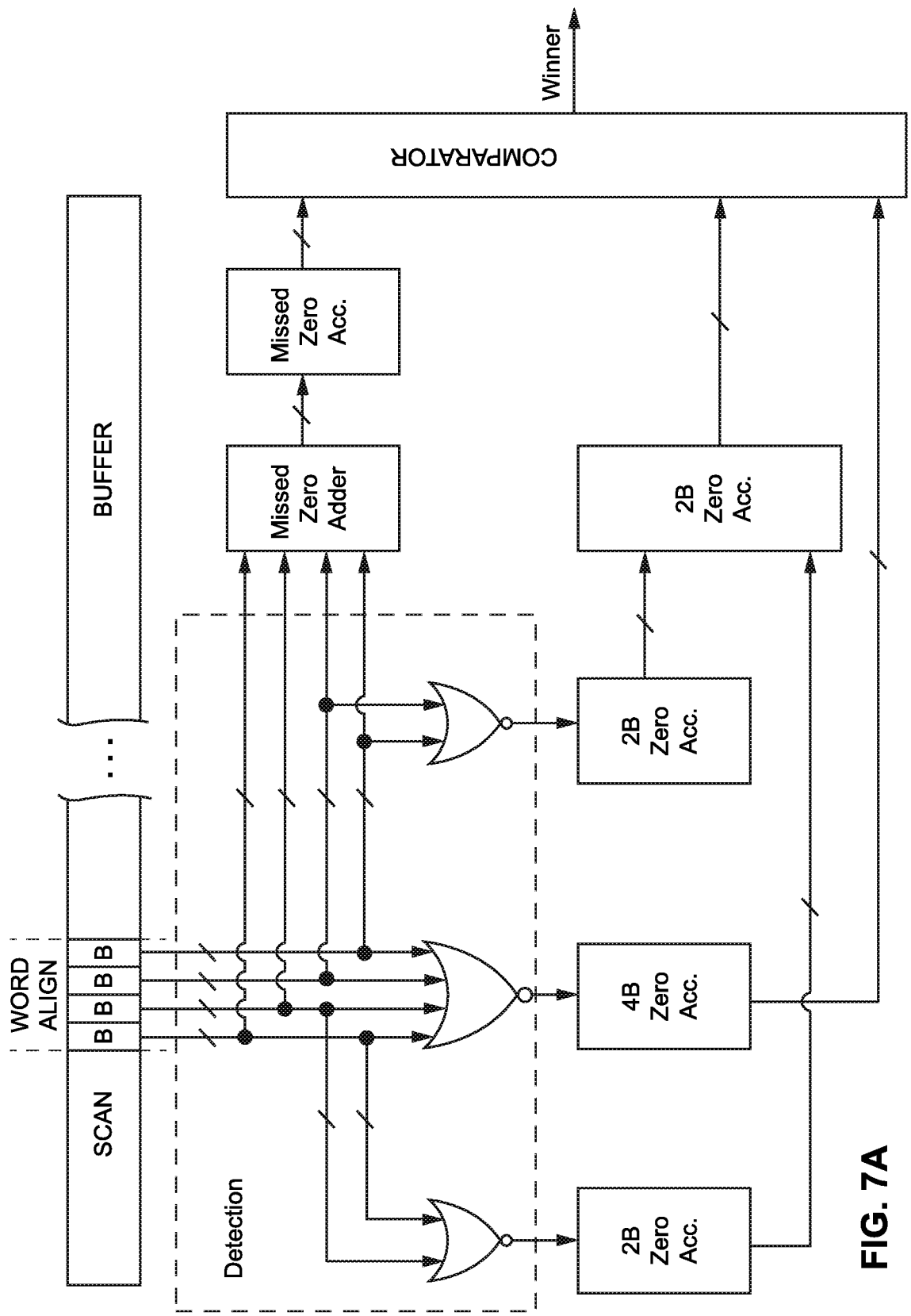
FIG. 7A shows an example non-limiting conceptual hardware implementation.

The encoder 612 may be configured to encode the received data based on the distribution of zeros or other symbols or values in the data as described above. FIG. 7A shows an example hardware implementation using combinatorial logic, but many hardware implementations are possible. FIG. 7A shows a scan buffer allocated in cache memory 616 that is scanned by hardware logic circuits (represented as NOR gates) to detect missed zeros, 2B zeros and 4B zeros. Counters count the number of 2B zeros, 4B zeros and missed zeros in the scan buffer. Adders are used to compute the total number of 2B zeros and the total number of missed zeros. A hardware comparator compares the results (as discussed above) to determine the winner of a cost vs. benefit tradeoff between missed zeros and increased packing granularity. Scanning of the scan buffer by the hardware shown can be sequential (for example, the scan buffer can be a shift register), or additional copies of the hardware shown can be used to allow detection of the entire scan buffer all at once. Further logic can be added to use the gate outputs to detect true data type. The FIG. 7A diagram is conceptual, and one skilled in the art will understand that detailed implementations can use a variety of alternative gates, multiplexers, logic arrays and other digital logic circuitry. Additional hardware complexity increased the real estate on a wafer required to implement the hardware and also increases power consumption, but may decrease latency as compared to software implementations.

Using hardware such as shown in FIG. 7A, the cache controller 610 may analyze the received data or only a portion of the received data to detect the data type of the data and/or granularity to use for the encoding and provide parameters to the encode 612 to encode the data using the determined granularity. Based on the analysis of the received data, the encoder 612 is configured to compress the data at the determined granularity. The compression itself can be performed by an arrangement of registers, logic circuitry and memory read/write circuitry operated by a sequential state machine.

Figure 3A:
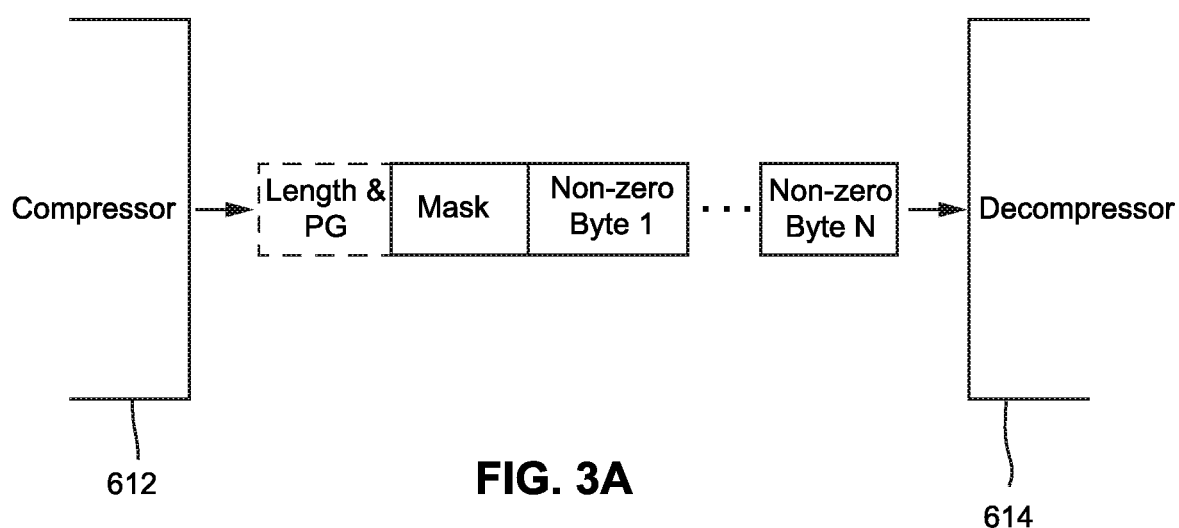
FIG. 3A shows an example data stream between a compressor and a decompressor.

When requests for the data in the cache controller 610 are made, the decoder 614 may decompress the data and store it into cache memory 616. In some embodiments, the compressed data may be sent to the requesting component without decompression and the requesting component may decompress the data. The parameters used for the compression (e.g., granularity) and/or the compression rate (e.g., factor of 2 or 4) may be provided to the requesting component as metadata with the compressed data or separate from the compressed data. The data type and/or the granularity used for the encoding may be transmitted separately from the data or included as part of the data (e.g., using two bits to store 3 options). See FIG. 3A. This metadata may be used to decompress the compressed data. In some embodiments, instead of the "length" and/or packing granularity ("PG") information as in FIG. 3A, other information may be provided to enable the decoder identify which portion of the compressed data corresponds to the mask and which portion of the data corresponds to the compressed non-zero elements. Using this information and the size of the compressed block, the packing granularity can be derived.

Operating the encoder 612 in the cache controller 610 according to various embodiments allows for the compression of data so that the storage capacity is amplified and the bandwidth from the cache controller 610 to the memory 610 (e.g., DRAM) and back is reduced. The cache controller 610 can be configured to operate as a coalesce buffer, receiving data from multiple sources at different times, compressing the received data, and writing the compressed data to memory 670. The cache controller 610 may also be configured as a write back cache, which holds the compressed data before it is written back to the memory 670. However, there may not be a need to write the compressed data to memory unless there is a need to evict the data from the cache controller 610. The cache controller 610 may operate with a write once read many configuration or with a write once read once configuration.

In some embodiments, the determination of the data type and/or the compression of the data may be performed outside of the cache controller 610, and the cache controller 610 may receive already compressed data. The cache controller 610 may use the decoder 614 to decompress the data or may use the encoder 612 to further compress the data by other compression techniques (e.g., run-length encoding).

Embodiments for determining the data type and the granularity for encoding disclosed in this application are not limited to being implemented on the system shown in FIGS. 7 and 7A, and they can be implemented by systems comprising, for example, singly or in any combination, analog circuitry, digital circuitry, hardwired circuitry, programmable circuitry, state machine circuitry, firmware that stores instructions executed by programmable circuitry, a semiconductor device and/or microelectronic device, custom logic, site arrays, etc.

Implementations of the above are not limited to the specific examples disclosed. For example, the determination of the data type and granularity are not limited to deep learning applications but can be applied on any general purpose data workload where surfaces are not decorated with the underlying data type. In addition, determination of the data type and granularity are not limited to the number and/or data types provided in the examples.

In some implementations, instead of looking at the distribution of zeros, technique could be modified to look at distribution of particular values or patterns. For example, in a rendered surface compressor, a rendered surface could have many different surface types with RGBA surfaces representing red, green, blue and alpha channel. These surfaces could have eight bits per channel, 16 bits per channel, or could have a non-uniform distribution (e.g., have no alpha channel and 10 bits for blue, 11 bits for green and 11 bits for red). The data type may be determined by looking at the distribution of zeros and/or ones in the data. Similarly, the data encoder may be set based on the determined data type and/or the distribution of values in the data. While today in many common graphics applications the data types are tagged (e.g., data in a frame or image buffer is tagged with what kind of data it is), the above disclosed methods could be applied to determine the data type and/or the granularity for compression when this information is not available or can be dropped to improve performance.

One or a plurality of the above illustrated operations of the methods described herein may be implemented in a computer program that may be stored on a non-transitory storage medium having instructions to program a system to perform the operations. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

Thus, in the above description, numerous specific details are set forth to provide a more thorough understanding, but it will be apparent to one of ordinary skill in the art that the technology herein may be practiced without one or more of these specific details. Well-known features have not been described in order to avoid obscuring the disclosed non-limiting implementations.

While the invention has been shown and described with reference to particular embodiments, it will be understood to those skilled on the art that various changes in form and detail may be made without departing from the scope of the invention as defined by the appended claims. Those skilled in the art to which this application relates will appreciate that other and further additions, deletions, substitutions and modifications may be made to the described embodiments.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

The invention claimed is:

1. One or more processing units comprising:
one or more circuits to:
select one or more compression techniques of data based, at least in part, on one or more identified data lengths of the data, wherein the data lengths of the data are identified based, at least in part, on one or more patterns of bits of data to be compressed by one or more datatype compression techniques;
determine, based on distribution of data in a subset of the data, an underlying data type of the data; and
replace, using the underlying data type, one or more elements in the data having a negative value with zero values before compression of the data.

2. The one or more processing units of claim 1 wherein the one or more patterns of bits of data indicates precision of the data to be compressed.

3. The one or more processing units of claim 1, wherein the data includes binary data and the datatype of data to be compressed is determined based on distribution of zeros in a subset of the data.

4. The one or more processing units of claim 1, wherein the data is compressed based, at least in part, on:
selectively omitting elements of a data width;
generating a mask comprising data that represents each omitted element; and
outputting the mask and non-omitted elements.

5. The one or more processing units of claim 1, wherein the one or more circuits are further to:
inspect a subset of the data to detect a distribution of data;
infer an element size of the data based on the detected distribution of data; and
compress the data using the inferred element size.

6. The one or more processing units of claim 1 wherein the data to be compressed is determined based on distribution of non-zeros in a subset of the data.

7. A method comprising:
selecting one or more compression techniques of data based, at least in part, on one or more identified data lengths of the data, wherein the data lengths of the data are identified based, at least in part, on one or more patterns of bits of data to be compressed by one or more datatype compression techniques;
determining, based on distribution of data in a subset of the data, an underlying data type of the data; and
replacing, using the underlying data type, one or more elements in the data having a negative value with zero values before compression of the data.

8. The method of claim 7 wherein the one or more patterns of bits of data indicates precision of the data to be compressed.

9. The method of claim 7, wherein:
the datatype of data to be compressed is determined based on distribution of zeros in a subset of the data;
an element size is inferred based on the datatype of data to be compressed; and
the data is compressed by:
removing elements with the inferred element size and zero value from the data;
generating a mask representing each element in the data and positions of removed elements; and
appending the remaining elements in the data with the generated mask.

10. A data compressor including a processing circuit to:
select one or more compression techniques of data based, at least in part, on one or more identified data lengths of the data, wherein the data lengths of the data are identified based, at least in part, on one or more patterns of bits of data to be compressed by one or more datatype compression techniques;
determine, based on distribution of data in a subset of the data, an underlying data type of the data; and
replace, using the underlying data type, one or more elements in the data having a negative value with zero values before compression of the data.

11. The data compressor of claim 10, wherein the processing circuit is further configured to determine a true data type of the data based on distribution of data in a subset of the data.

12. The data compressor of claim 10, wherein the data comprises binary data and the one or more compression techniques comprise a plurality of possible granularities including one byte, two bytes, and four bytes.

13. The data compressor of claim 10, wherein:
the data comprises sparse binary data; and
selecting the one or more compression techniques includes selecting a granularity based on distribution of zeros in a subset of the data.

14. The data compressor of claim 13, wherein the data is compressed based, at least in part, on:
removing zeros with the selected granularity from the data;
generating a mask representing each said zero; and
concatenating remaining elements in the data with the generated mask.

15. The data compressor of claim 14, wherein selecting the granularity comprises:
the subset of the data is determined by a first value by counting number of zero bytes that would not be removed during the compression if two byte granularity is to be used with compression and determine a second value by counting number of zero bytes that would not be removed during the compression if four byte granularity is to be used with compression;
scale the first value and the second value, by multiplying the first value and the second value by size of the data and dividing by size of the subset of the data;
calculate a two byte granularity value by: 2*(the size of block of binary data/32)–the scaled first value;
calculate the four byte granularity value by: 3*(the size of block of binary data/32)–the scaled second value;
if the two byte granularity value and the four byte granularity value are less than zero, select one byte granularity; and
if the two byte granularity value or the four byte granularity value are greater than zero, select two byte granularity when two byte granularity value is greater than the four byte granularity value, and select four byte granularity when four byte granularity value is greater than the two byte granularity value.

16. The data compressor of claim 10, wherein the processing circuit further configured to:
inspect a subset of the data to detect distribution of a predetermined value;
based on distribution of the predetermined value in the subset of the data, select a granularity from a plurality of possible granularities; and
compress the data by transforming portions of the data set in the selected granularity.

17. The data compressor of claim 16, wherein the predetermined value are bytes of zeros, and the plurality of possible granularities include one byte, two bytes, and four bytes.

18. A non-transitory memory storing instructions that when executed by at least one processor control the at least one processor to perform steps comprising:
selecting one or more compression techniques of data based, at least in part, on one or more identified data lengths of the data, wherein the data lengths of the data are identified based, at least in part, on one or more patterns of bits of data to be compressed by one or more datatype compression techniques;
determining, based on distribution of data in a subset of the data, an underlying data type of the data; and
replacing, using the underlying data type, one or more elements in the data having a negative value with zero values before compression of the data.

19. A computer system comprising:
a processor;
a main memory storing data to be compressed; and
cache system including a cache memory, a cache encoder, and a cache controller, wherein the cache controller is in communication with the processor and the main memory, and is configured to:
receive the data stored in the main memory;
select one or more compression techniques based, at least in part, on one or more identified data lengths of the data, wherein the data lengths of the data are identified based, at least in part, on one or more patterns of bits of data to be compressed by one or more datatype compression techniques;
determine, based on distribution of data in a subset of the data, an underlying data type of the data;
replace, using the underlying data type, one or more elements in the data having a negative value with zero values before compression of the data; and
configure the cache encoder to compress the data using the selected compression techniques.

20. The computer system of claim 19, wherein the cache controller is further configured to store compressed data in the cache memory and/or transmit the compressed data to the processor or the main memory.

21. The computer system of claim 19, wherein the cache system further includes a decoder configured to, based on the selected compression techniques to be used with compressing the data, decompress compressed data stored in the cache memory.

22. The computer system of claim 19, wherein the data is compressed by:
removing elements with a selected element size and value of zero from the data;
generating a mask representing each element in the data and indicating which elements in the data have zero values; and
concatenating the remaining elements with the generated mask.

23. The computer system of claim 22, wherein size of the data corresponds to size of a buffer allocated in the cache system, and selecting the element size comprises:
determining a first value by counting number of zero bytes that would not be removed during the compression if two byte element size is to be used with compressing the received data set and determine a second value by counting number of zero bytes that would not be removed during the compression if four byte element size is to be used with compressing the received data set;
calculate a two byte benefit by: 2*(size of the buffer/32)–the first value;
calculate a four byte benefit by: 3*(size of the buffer/32)–the second value;
if the two byte benefit and the four byte benefit do not show improvement over a one byte element size, select one byte element size; and
if the two byte benefit or the four byte benefit do show improvement over the one byte element size, select two byte element size when two byte benefit is greater than the four byte benefit, and select four byte element size when four byte benefit is greater than the two byte benefit.

24. The computer system of claim 22, wherein size of the data corresponds to size of a buffer allocated in the cache system.

25. The computer system of claim 22, wherein the one or more compression techniques comprise a plurality of possible element sizes includes one byte, and multiples of one byte.

26. The computer system of claim 22, wherein the data does not include a data type indicator.

27. The computer system of claim 22, wherein selecting the element size includes, determining, without compressing the data, number of bytes that are needed to perform compression of a subset of the data by each of a plurality of possible element sizes, and selecting the element size with which the least number of bytes are needed to compress the subset of the data.

28. The computer system of claim 19, further configured to:
   inspect a data set to detect a distribution of data;
   infer a true data type based on the detected distribution of data;
   based on the inferred data type, selecting a compression mode; and
   compress the data set using the selected compression mode.

29. The computer system of claim 28, wherein the data type is inferred based on a distribution of zero bytes in the data set, and the inferred data type is one of 8-bit integer data, half precision floating-point data, or single precision floating-point data.

30. A data decompressor comprising:
   an input circuit to;
      receive (a) compressed data, and (b) a detection parameter generated by a compressor that indicates one or more compression techniques selected based, at least in part, on one or more identified data lengths of the data, wherein the data lengths of the data are identified based, at least in part, on one or more patterns of bits of data to be compressed by one or more datatype compression techniques;
      determine, based on distribution of data in a subset of the data, an underlying data type of the data;
      replace, using the underlying data type, one or more elements in the data having a negative value with zero values before compression of the data;
   a mode selector that selects from a plurality of decoding modes based at least in part on the detection parameter; and
   a decoder that operates in the selected decoding mode to decode the compressed data.

31. The data decompressor of claim 30 wherein the input circuit, mode selector and decoder comprise hardware circuits within an L2 cache.

32. The data decompressor of claim 30 wherein the compressed data includes a mask having plural entries, and a proportion specifies data width corresponding to each entry in the mask.

33. The data decompressor of claim 30 wherein the mode selector selects between a lossy mode and a lossless mode based at least in part on a detected true data type.

34. The data decompressor of claim 30 wherein the mode selector selects between multiple lossy modes based at least in part on a detected true data type.

35. The data decompressor of claim 30 wherein the compressed data comprises sparse data.

\* \* \* \* \*